(12) United States Patent
Tsai et al.

(10) Patent No.: US 11,306,973 B2
(45) Date of Patent: Apr. 19, 2022

(54) LIQUID COOLING HEAT EXCHANGER AND METHOD FOR MAKING THE SAME

(71) Applicant: Cooler Master Co., Ltd., New Taipei (TW)

(72) Inventors: Chang-Han Tsai, New Taipei (TW); Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 123 days.

(21) Appl. No.: 16/865,702

(22) Filed: May 4, 2020

(65) Prior Publication Data

US 2020/0263931 A1     Aug. 20, 2020

Related U.S. Application Data

(63) Continuation of application No. 15/916,412, filed on Mar. 9, 2018, now abandoned.

(30) Foreign Application Priority Data

Mar. 10, 2017    (CN) .......................... 201720232080.2

(51) Int. Cl.
| | |
|---|---|
| *F28D 9/00* | (2006.01) |
| *F28F 3/02* | (2006.01) |
| *F28F 3/12* | (2006.01) |
| *H05K 7/20* | (2006.01) |
| *F28F 21/08* | (2006.01) |
| *H01L 23/473* | (2006.01) |
| *B23P 15/26* | (2006.01) |
| *H01L 23/367* | (2006.01) |

(52) U.S. Cl.
CPC ............ *F28D 9/0062* (2013.01); *B23P 15/26* (2013.01); *F28F 3/025* (2013.01); *F28F 3/12* (2013.01); *F28F 21/084* (2013.01); *F28F 21/089* (2013.01); *H01L 23/473* (2013.01); *H05K 7/20218* (2013.01); *H05K 7/20263* (2013.01); *F28F 2245/00* (2013.01); *F28F 2275/04* (2013.01); *F28F 2280/06* (2013.01); *H01L 23/3672* (2013.01); *H01L 23/3677* (2013.01)

(58) Field of Classification Search
CPC ............... B23P 15/26; Y10T 29/49366; Y10T 29/49368
See application file for complete search history.

(56) References Cited

U.S. PATENT DOCUMENTS

| | | | | |
|---|---|---|---|---|
| 2,154,217 A | * | 4/1939 | Savage | ................... B21D 53/04 29/890.039 |
| 3,451,114 A | * | 6/1969 | Hans | ..................... F28D 1/0333 228/183 |

(Continued)

*Primary Examiner* — Jason L Vaughan
(74) *Attorney, Agent, or Firm* — Locke Lord LLP; Tim Tingkang Xia, Esq.

(57) ABSTRACT

The disclosure provides a liquid cooling heat exchanger, comprising a first cover plate, a second cover plate and a fin, the first cover plate and the second cover plate stacked on each other so as to form a chamber therebetween, the fin disposed within the chamber, the first cover plate made of a composite material, wherein there is a bonding layer between the first cover plate and the second cover plate, and the bonding layer has a melting point lower than melting points of the first cover plate, the second cover plate and the fin. The disclosure also relates to a method for making the liquid cooling heat exchanger.

6 Claims, 9 Drawing Sheets

(56) References Cited

U.S. PATENT DOCUMENTS

| | | | | |
|---|---|---|---|---|
| 4,270,602 | A * | 6/1981 | Foster | F28D 9/0043 |
| | | | | 165/167 |
| 4,592,414 | A * | 6/1986 | Beasley | F28D 1/0333 |
| | | | | 165/153 |
| 4,915,163 | A * | 4/1990 | Matsunaga | F28D 1/0341 |
| | | | | 165/152 |
| 5,295,302 | A * | 3/1994 | Takai | B21C 37/14 |
| | | | | 228/183 |
| 5,369,883 | A * | 12/1994 | So | F28D 9/0043 |
| | | | | 29/890.039 |
| 5,517,757 | A * | 5/1996 | Hayashi | B60H 1/3227 |
| | | | | 165/153 |
| 6,286,201 | B1 * | 9/2001 | Prater | B21C 37/0803 |
| | | | | 29/727 |
| 6,651,332 | B2 * | 11/2003 | Matsuzaki | B21D 53/04 |
| | | | | 29/890.039 |
| 7,219,720 | B2 * | 5/2007 | Wakita | B23P 15/26 |
| | | | | 165/153 |
| 2007/0261243 | A1 * | 11/2007 | Yang | B23P 15/26 |
| | | | | 29/890.03 |
| 2009/0260785 | A1 * | 10/2009 | Wang | F28D 15/0233 |
| | | | | 165/170 |
| 2017/0003085 | A1 * | 1/2017 | Fukumoto | B23P 15/26 |

* cited by examiner

LIQUID COOLING HEAT EXCHANGER AND METHOD FOR MAKING THE SAME

CROSS-REFERENCE TO RELATED APPLICATIONS

This is a continuation patent application of U.S. patent application Ser. No. 15/916,412, filed Mar. 9, 2018, entitled "LIQUID COOLING HEAT EXCHANGER". This non-provisional application claims priority under 35 U.S.C. § 119(a) on Patent Application No(s). 201720232080.2 filed in China on Mar. 10, 2017, the entire contents of which are hereby incorporated by reference.

TECHNICAL FIELD

The disclosure relates to a heat dissipation technique and a heat dissipation device, more particularly to a liquid cooling heat exchanger which is able to be produced through a continuous production line.

BACKGROUND

Generally, electronic devices require a heat dissipation device to remove heat in order to reduce the temperature in the electronic devices thereby extending its lifespan. The heat exchanger is an important part in the heat dissipation device, it is directly in contact with the heat source in the electronic devices, and it can remove the heat by coolant flowing therethrough.

There is a high demand in liquid tightness of the heat exchanger because the coolant flows through the heat exchanger. Usually, a liquid cooling heat exchanger has a top plate, a bottom plate and a fin that are jointed together. In order to do so, these components are connected by a soldering process or brazing process. During the soldering process, a solder material (e.g. tin paste) having a low melting point is coated between the components and to heat the solder material by a temperature higher than its melting point, the heated solder material becomes fluent and will fill the gap between the plates with the help of capillary effect, and then the plates will be bonded to each other when the solder material is solidified. During the brazing process, the plates are preliminary positioned by a jig, and then the plates are put into a vacuum furnace and heated up to their melting point or to a temperature higher than the melting point of the solder material so as to bond the plates.

However, in these processes, the soldering flux is difficult to be removed, and this directly affect the bonding quality. In addition, it requires to repeatedly perform the above processes to bond all of the components of the liquid cooling heat exchanger; that is, the conventional liquid cooling heat exchanger cannot be produced through a continuous production line, result in decrease of yield rate.

SUMMARY

Accordingly, the present disclosure provides a liquid cooling heat exchanger which is able to be produced through a continuous production line, all the components of the liquid cooling heat exchanger are bonded together so as to improve the bonding quality, and the components can be bonded through a continuous production line so as to increase the yield of the liquid cooling heat exchanger.

One embodiment of the disclosure provides a liquid cooling heat exchanger, comprising a first cover plate, a second cover plate and a fin, the first cover plate and the second cover plate stacked on each other so as to form a chamber therebetween, the fin disposed within the chamber, the first cover plate made of a composite material, wherein there is a bonding layer between the first cover plate and the second cover plate, and the bonding layer has a melting point lower than melting points of the first cover plate, the second cover plate and the fin.

One embodiment of the disclosure provides a liquid cooling heat exchanger, comprising a first cover plate, a second cover plate and a fin, the first cover plate and the second cover plate stacked on each other so as to from a chamber therebetween, the fin disposed within the chamber, the first cover plate made of a composite material, wherein there is a bonding layer between the first cover plate and the second cover plate, and the bonding layer has a melting point lower than melting points of the first cover plate, the second cover plate and the fin.

One embodiment of the disclosure provides a liquid cooling heat exchanger, comprising a first cover plate, a second cover plate and a fin, the first cover plate and the second cover plate stacked on each other so as to form a chamber therebetween, the fin disposed within the chamber, the first cover plate comprising a base plate and a bonding layer coated on the base plate, wherein the base plate of the first cover plate is thermally bonded to the second cover plate via the bonding layer, and the bonding layer of the first cover plate has a melting point lower than a melting point of the base plate of the first cover plate.

One embodiment of the disclosure provides a liquid cooling heat exchanger, comprising a first cover plate, a second cover plate and a fin, the first cover plate and the second cover plate stacked on each other so as to form a chamber therebetween, the fin disposed within the chamber, the first cover plate comprising a base plate and a bonding layer stacked on the base plate, wherein the base plate and the bonding layer are made of a material selected from a group consisting of a metal and an alloy thereof, the base plate of the first cover plate is thermally bonded to the second cover plate via the bonding layer, and the bonding layer of the first cover plate has a melting point lower than melting points of the base plate of the first cover plate, the second cover plate and the fin.

One embodiment of the disclosure provides a method for making a liquid cooling heat exchanger including: providing a first cover plate to a side of a second cover plate, wherein a chamber is formed between the first cover plate and the second cover plate; providing a fin in the chamber, wherein the first cover plate, the second cover plate, and the fin each are made of a composite material having a base plate coated with a bonding layer having a melting point lower than a melting point of the base plate; and melting the bonding layers of the first cover plate, the second cover plate, and the fin to form a single bonding layer between the base plates of the first cover plate and the second cover plate and a single bonding layer between the base plates of the second cover plate and the fin so as to bond the first cover plate, the second cover plate, and the fin together through a single process.

According to the liquid cooling heat exchanger and the method as discussed in above, the components in the liquid cooling heat exchanger are able to be bonded to each other through a single process because they are coated with the bonding layer, and the bonding layer is very thin, so the components are closely connected to each other so as to improve the bonding quality, and this enables the liquid cooling heat exchanger to be produced through a continuous production line, thereby increasing the yield of the liquid cooling heat exchanger.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
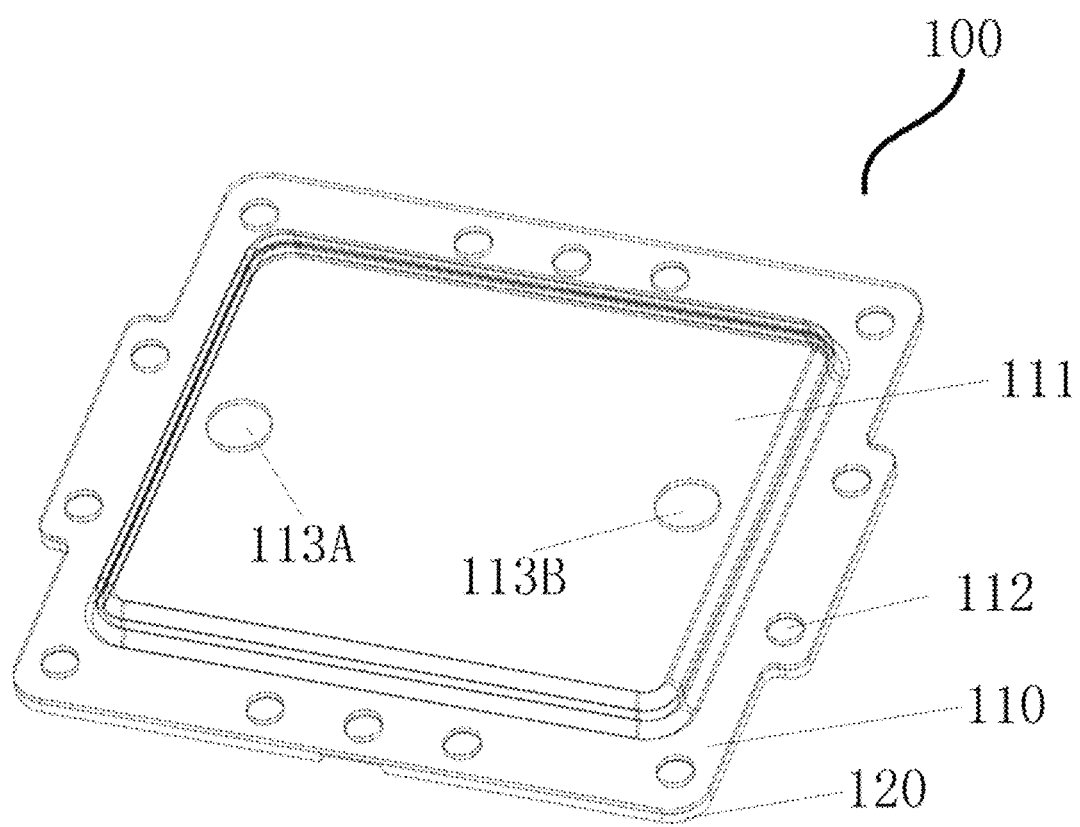
FIG. 1 is a perspective view of a liquid cooling heat exchanger according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known main structures and devices are schematically shown in order to simplify the drawing.

Figure 2:
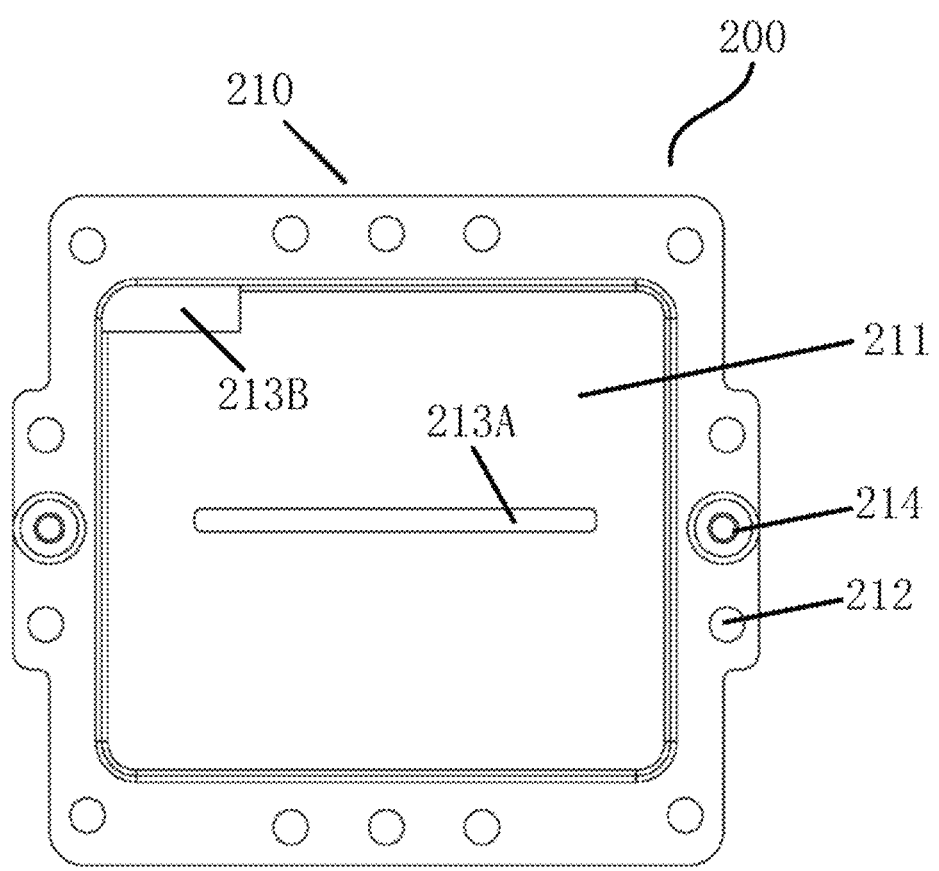
FIG. 2 is a top view of a liquid cooling heat exchanger according to a second embodiment of the disclosure.

Firstly, please refer to FIGS. 1 to 2, FIG. 1 is a perspective view of a liquid cooling heat exchanger according to a first embodiment of the disclosure, and FIG. 2 is a top view of a liquid cooling heat exchanger according to a second embodiment of the disclosure. In FIG. 1, a liquid cooling heat exchanger 100 includes a first cover plate 110 and a second cover plate 120 that are stacked on each other. The first cover plate 110 has a central area 111 protruding outward so as to create a chamber between the first cover plate 110 and the second cover plate 120 when they are stacked on each other, and there is a fin 130 (not shown in FIG. 1) fixed in the chamber. In some other embodiments, the first cover plate 110 and the second cover plate 120 each have a plurality bores 112 along their edge. These bores 112 can be used to fix the liquid cooling heat exchanger 100 on a heat source or on a compatible heat dissipation device. The heat dissipation device usually includes a heat dissipation component (e.g. heat fins or radiator) and a fan.

In some embodiments, the first cover plate 110 has two openings 113A and 113B which can be connected to a coolant piping of the heat dissipation device (not shown in figures) to allow the coolant to flow into the chamber between the first cover plate 110 and the second cover plate 120 through one of the openings to remove heat on the fin 130 and then to exist the chamber through the other opening. For example, the coolant can enter the liquid cooling heat exchanger 100 through the opening 113A and exist the liquid cooling heat exchanger 100 through the opening 113B. It is noted that the shapes of the openings are not restricted. For example, FIG. 2 shows a liquid cooling heat exchanger 200. The liquid cooling heat exchanger 200 has a first cover plate 210 having openings 213A and 213B which are different in size but are both in rectangular shape, the coolant can flow into the chamber through the opening 213A and exist the chamber through the opening 213B. In addition, in FIG. 2, except bores 212 formed along the edge of the first cover plate 210, there are fasteners 214 near the edge of the first cover plate 210. In this embodiment, the fastener 214 is a rivet nut. When the heat dissipation device is a large scale heat dissipation device, these fasteners 214 help to firmly fix the liquid cooling heat exchanger 200 in position.

Figure 3A:
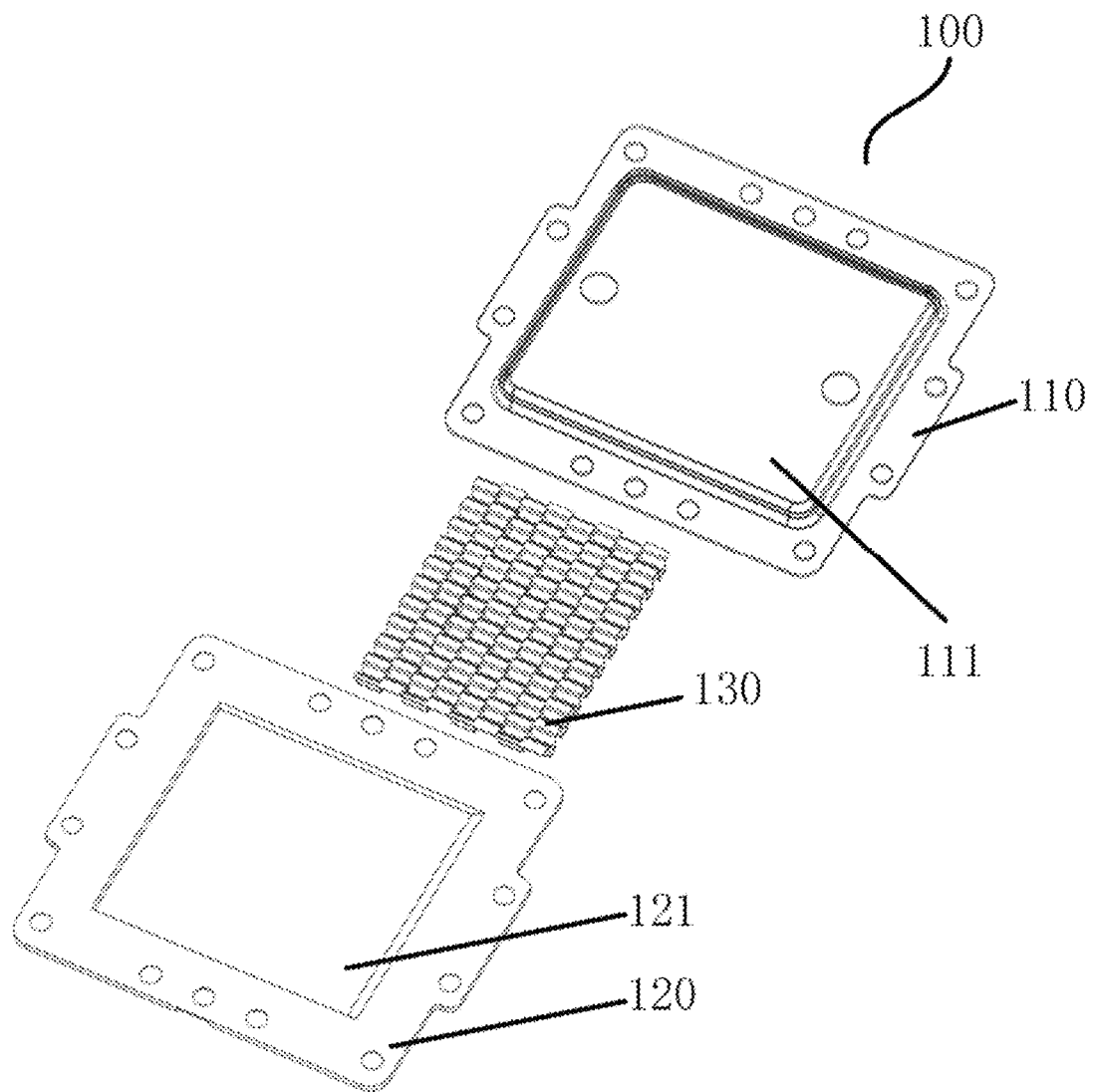
FIG. 3A is an exploded view of the liquid cooling heat exchanger of the first embodiment of the disclosure.
Figure 3B:
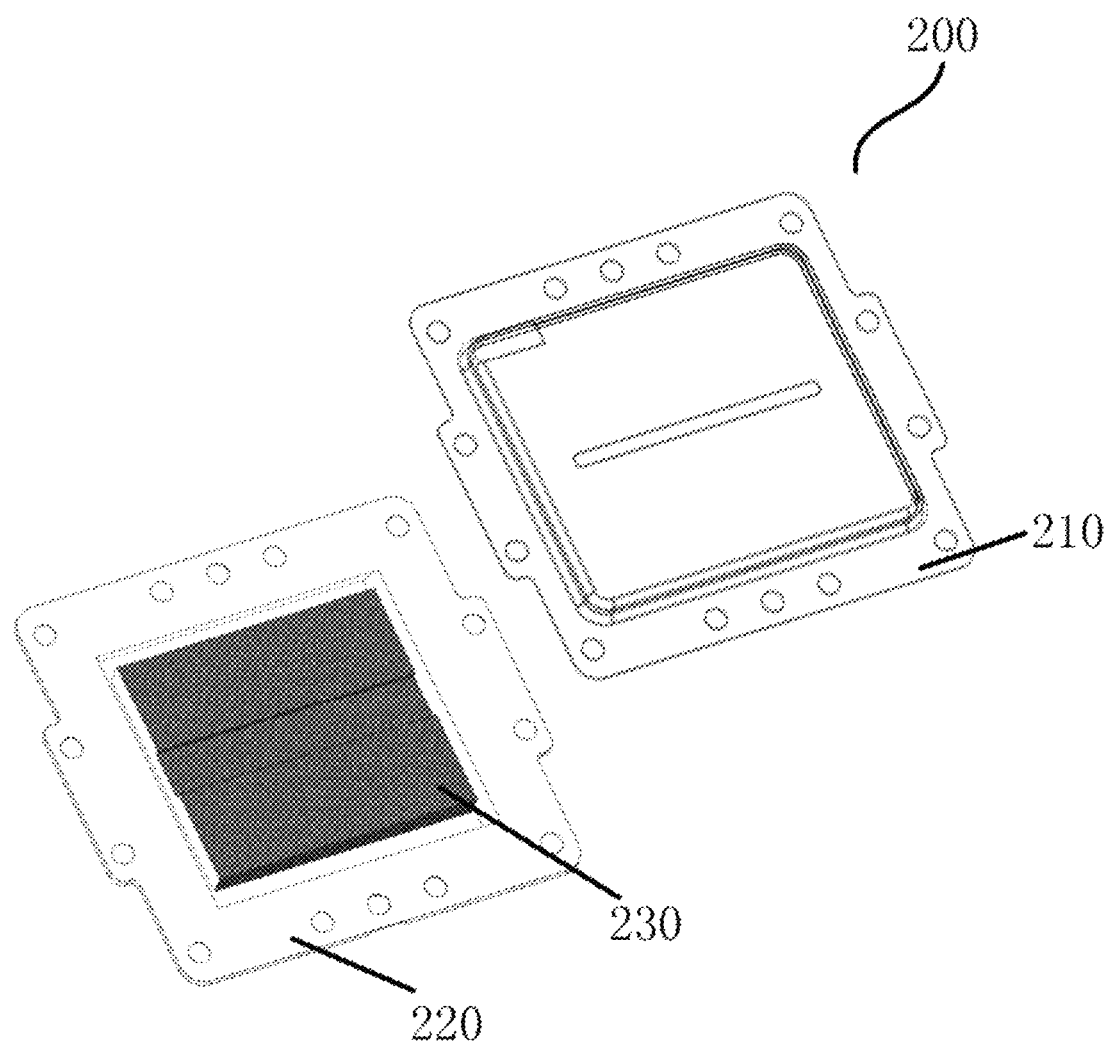
FIG. 3B is an exploded view of the liquid cooling heat exchanger according to the second embodiment of the disclosure.
Figure 3C:
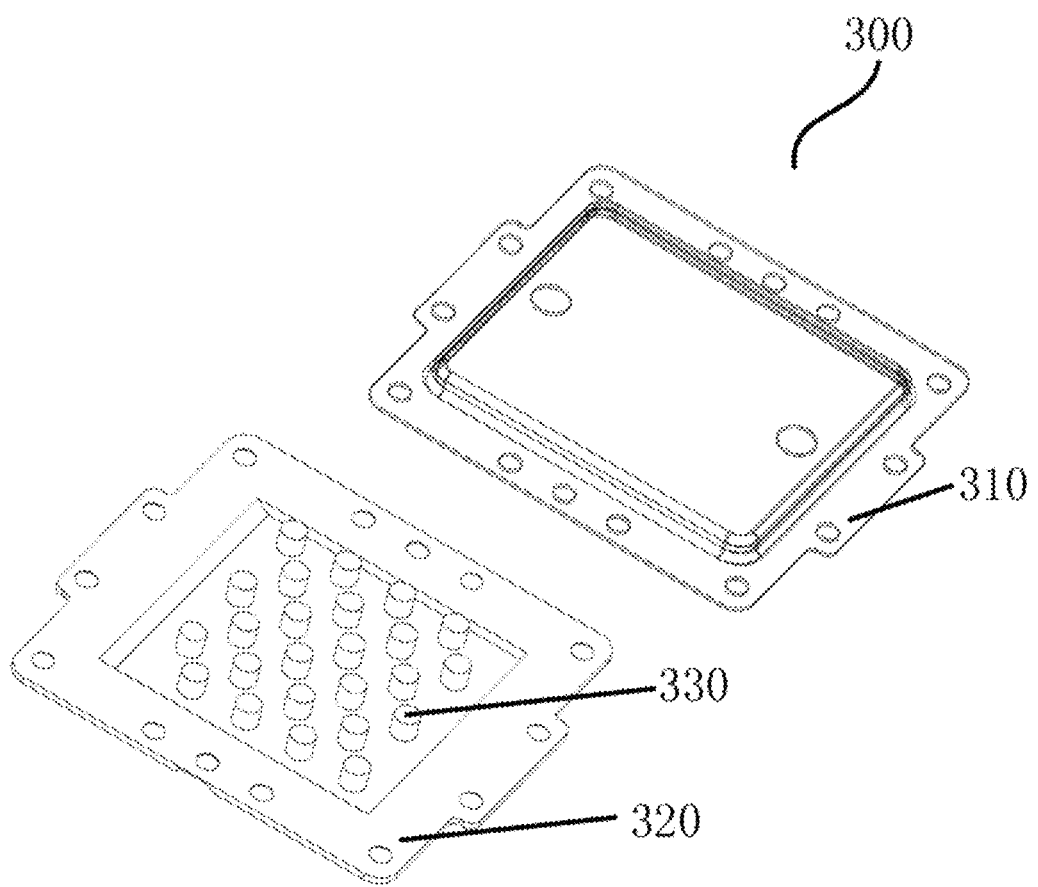
FIG. 3C is an exploded view of a liquid cooling heat exchanger according to a third embodiment of the disclosure.

Please refer to FIG. 1 and further refer to FIGS. 3A to 3C, FIG. 3A is an exploded view of the liquid cooling heat exchanger of the first embodiment of the disclosure, FIG. 3B is an exploded view of the liquid cooling heat exchanger according to the second embodiment of the disclosure, and FIG. 3C is an exploded view of a liquid cooling heat exchanger according to a third embodiment of the disclosure. FIG. 3A clearly show the structure of the liquid cooling heat exchanger 100. The second cover plate 120 also has a central area 121 protruding outward. Thus, the central areas 111 and 121 together form a chamber when the first cover plate 110 and the second cover plate 120 are stacked on each other, and the fin 130 is placed within the chamber. However, the design of the chamber is not restricted. For example, in some other embodiments, the first cover plate 110 may have the central area 111, but the second cover plate 120 may be a flat plate; alternatively, the second cover plate 120 may have the central area 121, but the first cover plate 110 may be a flat plate. The chambers in the above cases all can accommodate the fin 130. In addition, in this embodiment, the fin 130 has some parts that are offset. In detail, the fin 130 includes a plurality of metal strips each having several bent portions and placed offset with respect to adjacent metal strips, and this configuration is able to increase the thermal contact area thereby improving heat exchange efficiency. However, the present disclosure is not limited to the design of the fin 130. For example, as the liquid cooling heat exchanger 200 shown in FIG. 3B, it has a fin 230 which includes an arrangement of metal strips having teeth structures. In another example, as a liquid cooling heat exchanger 300 shown in FIG. 3C, it has a fin 330 which includes an arrangement of metal cylinders. In fact, any design that helps to increase the thermal contact area between the fin and the coolant should fall within the scope of the fin of the present disclosure.

Figure 4:
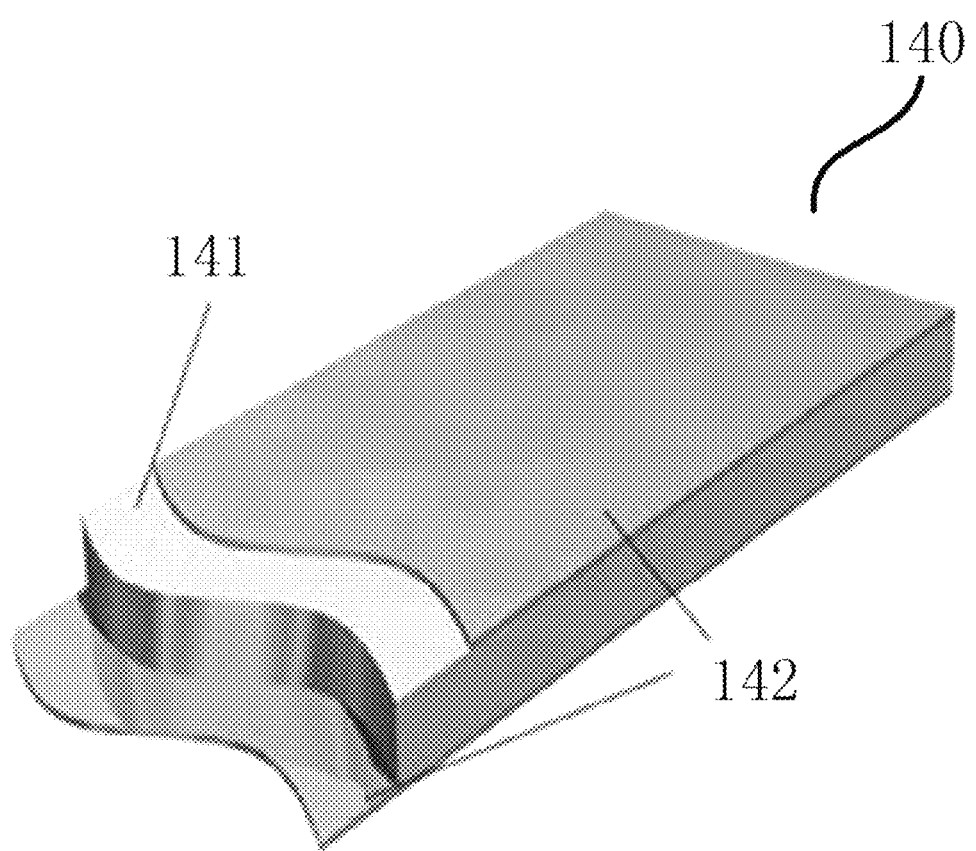
FIG. 4 is a schematic view of a liquid cooling heat exchanger according to one embodiment of the disclosure.

Please refer to FIG. 4, FIG. 4 is a schematic view of a liquid cooling heat exchanger according to one embodiment of the disclosure. There is a base material 140 made of a composite material. A base plate 141 is the main body of the material, and the surfaces of the base plate 141 are coated with a bonding layer 142 which is made of a material different from that of the base plate 141. Thus, the term "composite material" in the present disclosure means the material that the base plate is coated by bonding layers in a different material. In some other embodiments, the base plate 141 is made of, for example, pure aluminum (melting point is 660° C.), aluminum alloy (e.g. manganese-aluminum alloy AA3003 with a melting point approximately 643° C., or aluminum alloy AA3005 with a melting point approximately between 630° C. and 655° C.), and the bonding layer 142 is made of, for example, an aluminum alloy with a melting point lower than that of the base plate 141 (e.g. silicon-aluminum alloy AA4343 with a melting point approximately 582° C., or silicon-aluminum alloy AA4045 with a melting point approximately between 574° C. and 599° C.). As such, when the first cover plate 110, the second cover plate 120 and the fin 130, which are all made of the base material 140, are assembled to become the liquid cooling heat exchanger 100, they can be bonded together at a specific temperature between the melting point of the bonding layer 142 and the melting point of the base plate 141 (e.g. 600° C.).

As discussed above, the base plate 141 and the bonding layer 142 covering the base plate 141 can be made of a particular metal or the alloy thereof, and the metal is aluminum in the above embodiments. However, the present disclosure is not limited thereto. For example, in some other embodiments, the metal may be gold, silver, or copper.

Figure 5A:
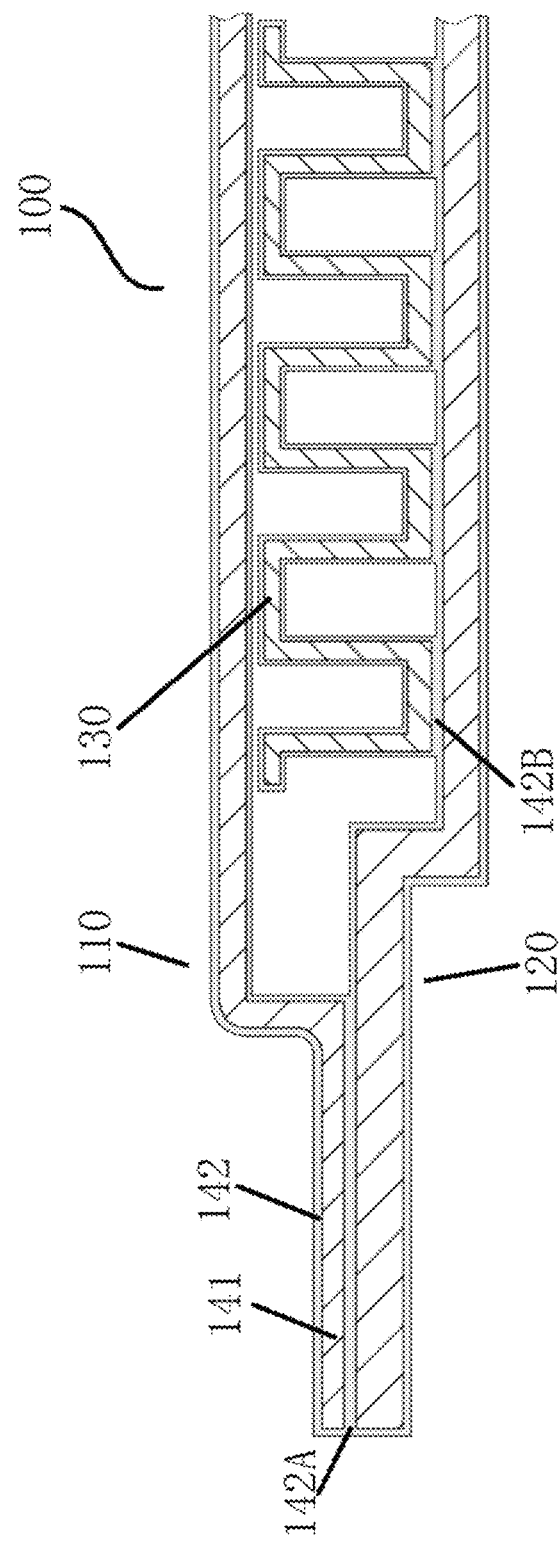
FIG. 5A is a partial cross-sectional view of a liquid cooling heat exchanger according to one embodiment of the disclosure.
Figure 5B:
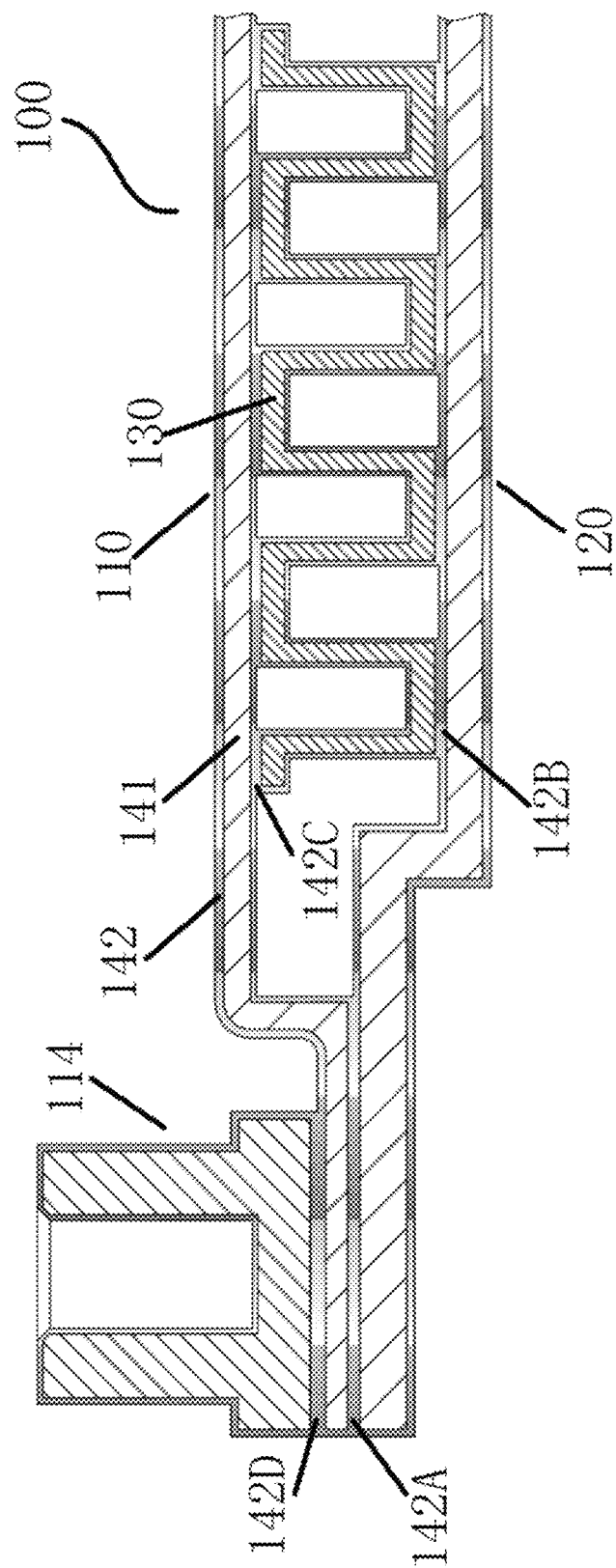
FIG. 5B is a partial cross-sectional view of a liquid cooling heat exchanger having fastener according to one embodiment of the disclosure.

Please refer to FIGS. 5A and 5B, FIGS. 5A and 5B each are a partial cross-sectional view of a liquid cooling heat exchanger of the present disclosure. FIG. 5A clearly shows the bonding of the components in the liquid cooling heat exchanger 100. In this case, the first cover plate 110, the second cover plate 120 and the fin 130 are all made of the base material 140 in FIG. 4; that is, all the components in the liquid cooling heat exchanger 100 all have a structure of the base plate 141 covered with the bonding layers 142. In this embodiment, it requires to circulate the coolant through the openings on the first cover plate 110, so the fin 130 is disposed on and in contact with the second cover plate 120 to leave a gap between the fin 130 and the first cover plate 110. Thus, when the coolant is flowing in the chamber, the coolant is able to reach each surface of the fin 130 in order to achieve a better heat transfer effect. When the first cover plate 110, the second cover plate 120 and the fin 130 are bonded together, the parts where the bonding layers 142 of the first cover plate 110 and the second cover plate 120 are in contact with each other are melted together through siphon effect and natural diffusion to form a bonding layer 142A. Similarly, the parts where the second cover plate 120 and the fin 130 are in contact with each other are melted to become a bonding layer 142B. Since the gap is between the fin 130 and the first cover plate 110, the bonding layers 142 of the fin 130 and the first cover plate 110 are not formed into one piece. However, in some other embodiments, the fin 130 may be in contact with both of the first cover plate 110 and the second cover plate to achieve a more stable structure of the liquid cooling heat exchanger 100. As shown in FIG. 5B, the bonding layers 142 of the first cover plate 110 and the second cover plate 120 are melted into a single piece to become the bonding layer 142A, the bonding layers 142 of the second cover plate 120 and the fin 130 are melted into a bonding layer 142B, and the bonding layers 142 of the first cover plate 110 and the fin 130 are also melted to become a bonding layer 142C. In addition, in the case that the liquid cooling heat exchanger 100 has a nut 114 near the edge of the first cover plate 110, the nut 114 is also made of the base material 140 in FIG. 4. Thus, the nut 114 and the first cover plate 110 can be bonded to create a bonding layer 142D. It is understood that all the components in FIG. 5A and FIG. 5B are coated with the bonding layer 142. Thus, the parts of the bonding layers 142 on the first cover plate 110, the second cover plate 120, the fin 130 and the nut 114 that are not in contact with another bonding layer 142 is remained. In addition, it is noted that the bonding layer 142 shown in FIGS. 5A and 5B are exaggerated in size to make them easy to be visible, but they can be very thin in made in real case. Accordingly, when both sides of the liquid cooling heat exchanger 100 are bonded, the quality of the connection among these components are improved.

Moreover, except the bonding layer of the composite material, the first cover plate 110, the second cover plate 120 or the fin 130 in the figures may be bonded via the composite material and a solder material (e.g. tin paste) at the same time. For example, in some other embodiments, the first cover plate 110 may be made of the composite material, and the bonding layer between the second cover plate 120 and the fin 130 may be formed from the solder material. Alternatively, in another embodiment, the second cover plate 120 may be made of the composite material, and the bonding layer between the first cover plate 110 and the fin 130 may be formed from the solder material.

In other words, the bonding layers of the first cover plate 110, the second cover plate 120 and the fin 130 exist before assembling the first cover plate 110, the second cover plate 120 and the fin 130. When it is attempt to assemble the first cover plate 110, the second cover plate 120 and the fin 130, one can thermally bond the bonding layers of the first cover plate 110 and the second cover plate 120 and thermally bond the bonding layers of the second cover plate 120 and the fin 130.

Figure 6:
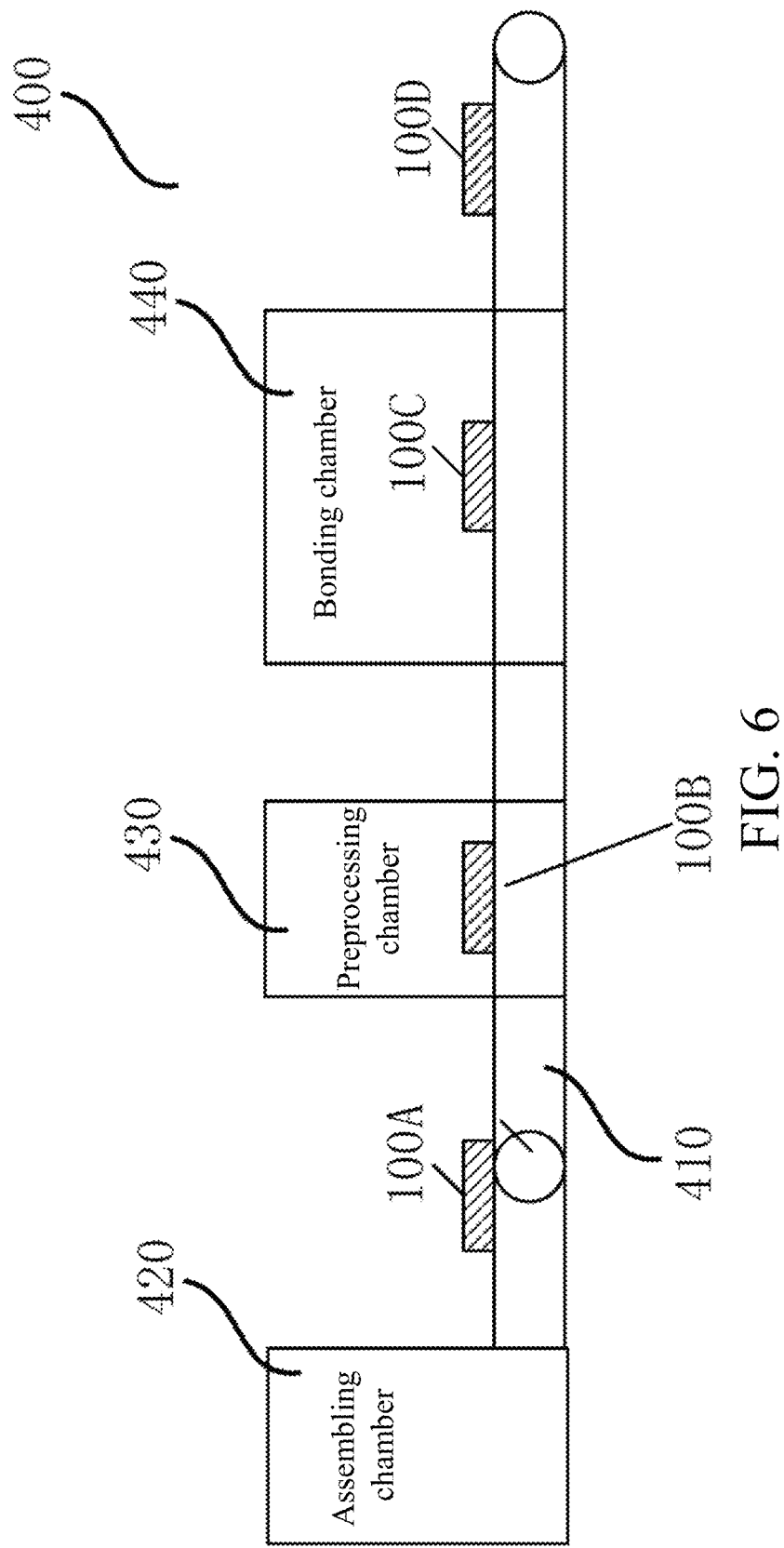
FIG. 6 is a schematic view of a production line according to one embodiment of the disclosure.

Please further refer to FIG. 6, FIG. 6 is a schematic view of a production line according to one embodiment of the disclosure. There is a conveyor belt 410 linking an assembling chamber 420, a preprocessing chamber 430 and a bonding chamber 440. The assembling chamber 420 is used to produce and assemble the components of the liquid cooling heat exchanger 100, and then the assembled liquid cooling heat exchanger 100A is delivered to the preprocessing chamber 430 by the conveyor belt 410. The preprocessing chamber 430 can perform pre-processes to the liquid cooling heat exchanger 100A, including degreasing and spraying soldering flux. After that, the liquid cooling heat exchanger 100B is delivered to the bonding chamber 440 by the conveyor belt 410. The components in the liquid cooling heat exchanger 100B are bonded in the bonding chamber 440. Then, the liquid cooling heat exchanger 100C will be sent out of the bonding chamber 440 by the conveyor belt 410, and then the liquid cooling heat exchanger 100D will be sent to next processing chamber by the conveyor belt 410, for example, a cooling chamber or quality evaluation chamber, etc. (not shown in figures). As a result, the manufacturing of the liquid cooling heat exchanger can be achieved through a continuous production line, thereby largely improving the production efficiency.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A method for making a liquid cooling heat exchanger, comprising:

providing a first cover plate to a side of a second cover plate, wherein a chamber is formed between the first cover plate and the second cover plate;

providing a fin in the chamber, wherein the first cover plate, the second cover plate, and the fin each are made of a composite material having a base plate coated with a bonding layer having a melting point lower than a melting point of the base plate; and melting the bonding layers of the first cover plate, the second cover plate, and the fin to form a single bonding layer between the base plates of the first cover plate and the second cover plate and a single bonding layer between the base plates of the second cover plate and the fin so as to bond the first cover plate, the second cover plate, and the fin together through a single process, wherein the bonding layer of the composite material is made of aluminum alloy with a melting point ranging between 574° C. and 599° C.

2. The method according to claim 1, wherein there is a gap between the first cover plate and the fin.

3. The method according to claim 1, wherein at least one of the first cover plate and the second cover plate have a central area protruding outward to form the chamber.

4. The method according to claim 1, wherein the first cover plate and the second cover plate each have a plurality of bores along an edge thereof.

5. The method according to claim 1, further comprising:
providing a rivet nut made of the composite material; and
melting the bonding layer of the river nut and the first cover plate to form a single bonding layer between the base plates of the river nut and the first cover plate so as to bond the rivet nut to an edge of the first cover plate.

6. The method according to claim 1, wherein the first cover plate has two openings connected to the chamber.

\* \* \* \* \*